United States Patent
Kojima

[11] Patent Number: 6,072,241
[45] Date of Patent: Jun. 6, 2000

[54] SEMICONDUCTOR DEVICE WITH SELF-ALIGNED CONTACT AND ITS MANUFACTURE

[75] Inventor: Hideyuki Kojima, Kawasaki, Japan

[73] Assignee: Fujitsu Limited, Kanagawa, Japan

[21] Appl. No.: 09/035,331

[22] Filed: Mar. 5, 1998

[30] Foreign Application Priority Data

Sep. 9, 1997 [JP] Japan .................................. 9-243607

[51] Int. Cl.$^7$ .................................................. H01L 23/48
[52] U.S. Cl. ........................ 257/752; 257/755; 257/758; 257/770; 438/279
[58] Field of Search ................................... 438/145, 184, 438/200, 210, 330, 303, 399, 394, 396, 424, 637, 638, 639, 640, 700, 738, 740; 257/374, 389, 288, 244, 365

[56] References Cited

U.S. PATENT DOCUMENTS

| | | |
|---|---|---|
| 5,135,881 | 8/1992 | Saeki . |
| 5,296,339 | 3/1994 | Park . |
| 5,482,894 | 1/1996 | Havemann . |
| 5,517,044 | 5/1996 | Koyama . |
| 5,578,524 | 11/1996 | Fusake et al. . |
| 5,658,817 | 8/1997 | Jeong . |
| 5,728,595 | 3/1998 | Fusake . |
| 5,744,866 | 4/1998 | Horiba . |
| 5,780,356 | 7/1998 | Kim . |
| 5,789,291 | 8/1995 | Sung . |
| 5,866,947 | 3/1997 | Wang et al. . |
| 5,935,875 | 1/1997 | Lee . |

FOREIGN PATENT DOCUMENTS

| | | |
|---|---|---|
| 5-291530 | 11/1993 | Japan . |
| 5-335515 | 12/1993 | Japan . |
| 10-144788 | 5/1998 | Japan . |
| 10-303384 | 11/1998 | Japan . |
| 11-74226 | 3/1999 | Japan . |
| 11-87653 | 3/1999 | Japan . |
| 11-97529 | 4/1999 | Japan . |

*Primary Examiner*—John F. Niebling
*Assistant Examiner*—Jonathan Hack
*Attorney, Agent, or Firm*—Armstrong, Westerman, Hattori, McLeland & Naughton

[57] ABSTRACT

A method of manufacturing a semiconductor device having a self-aligned contact hole includes a step of forming first gate electrode structures having a high pattern density on a gate insulating film in a first area of a semiconductor substrate and second gate electrode structures having a low pattern density on the gate insulating film in a second area, a step of forming first and second insulating films having different etching characteristics over the semiconductor substrate, a step of anisotropically etching the first and second insulating films in the second area by masking the first area to form side spacers on the second gate electrode structures, a step of forming an interlayer insulating film over the semiconductor substrate, and a step of forming in a self-alignment manner an opening reaching the source/drain region in the first area, by using the second insulating film as an etching stopper. This method allows to reliably form a self-aligned contact hole even if the pattern density is high.

19 Claims, 10 Drawing Sheets

SEMICONDUCTOR DEVICE WITH SELF-ALIGNED CONTACT AND ITS MANUFACTURE

This application is based on a Japanese Patent Application No. 9-243607 filed on Sep. 9, 1997, the entire contents of which are incorporated herein by reference.

BACKGROUND OF THE INVENTION a) Field of the Invention

The present invention relates to a semiconductor device and its manufacture method, and more particularly to a semiconductor device having a high pattern density area with self-aligned contacts and a low pattern density area, and its manufacture method.

b) Description of the Related Art

As semiconductor devices are made highly integrated, fine pattern structures become necessary. Semiconductor memory devices such as dynamic random access memories (DRAMs) are used in the following description as illustrative examples only and not limitatively. In order to increase the memory capacity of a semiconductor memory device, each memory cell is required to be made fine. The peripheral circuit of the semiconductor memory device is not required to be so fine as the memory cell area, but it is necessary to maintain a drive power and a high reliability even at a low power supply voltage. It is therefore desired to form MOS transistors of an LDD structure in the peripheral circuit area.

DRAM memory cells of 2F×3F=6F$^2$ (where F is a minimum design size) are very effective for the reduction of a memory cell area. If the minimum design size is 0.20 to 0.25 $\mu$m, use of self-aligned contacts (SACs) of a storage electrode and a bit line is very effective for realizing DRAM of 6F$^2$ cells.

Figure 2A:
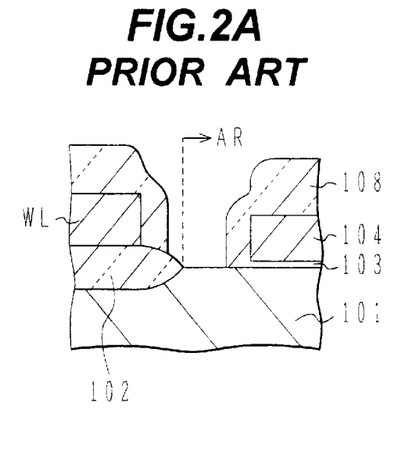
FIGS. 2A to 2D are schematic cross sectional views of semiconductor substrates illustrating conventional techniques.

FIGS. 2A to 2D are schematic diagrams showing the structures of conventional SACs. In FIG. 2A, a field oxide film 102 selectively formed on the surface of a silicon substrate 101 defines an active region AR. A gate oxide film 103 is formed on the silicon surface in the active region AR, and a gate electrode 104 is formed thereon. The field oxide film 102 has a word line WL formed thereon, the word line having the structure same as the gate structure. An insulating film 108 covers the upper surfaces and side walls of the gate electrode 104 and word line WL.

After this substrate structure is formed, an interlayer insulating film is formed over the insulating film 108, with an etching stopper layer being interposed therebetween. A resist mask is formed on the interlayer insulating film and etched to form a SAC window by using as an etching stopper the etch stopper layer on the upper surfaces and side walls of the gate electrode 104 and word line WL. During the SAC window etching process, however, the insulating film on the shoulders of the gate electrode 104 and word line WL is thinned as shown in FIG. 2A and a breakdown voltage of the insulating film lowers at the shoulders.

Figure 2B:
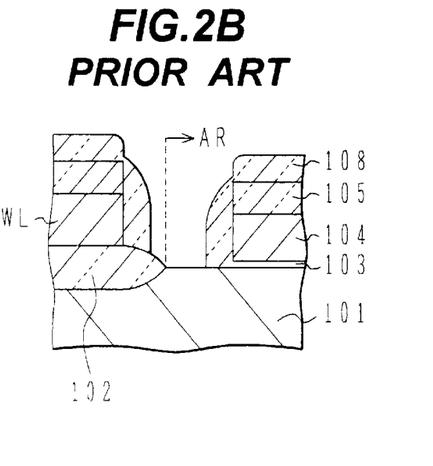

FIG. 2B shows an example of the SAC structure intended to raise the breakdown voltage at the shoulders of a gate electrode (word line). An insulating film 105 is stacked upon the gate electrode 104 and both of them are patterned using the same mask. Thereafter, an insulating film 108 is formed covering the upper surface and side walls of the laminated gate electrode structure. Since the insulating film 105 is formed on the gate electrode, the breakdown voltage at the shoulder of the gate electrode 104 can be raised.

In a more specific structure, the gate electrode 104 is made of a lamination of a doped amorphous silicon film and a tungsten silicide film, and the insulating film 105 on the gate electrode 104 is made of a lamination of a high-temperature oxide (HTO) film formed by high temperature CVD and an SiON antireflection film formed on the HTO film. This structure has been used in memory cells of 1.0 to 0.5 $\mu$m rules.

In the case of memory cells formed with 0.20 to 0.25 $\mu$m design rules, however, the height of the capacitor increases in order to provide a sufficient cell capacitance. Therefore, an aspect ratio of the SAC window becomes high. Manufacture of such a high aspect ratio is difficult by the structure shown in FIG. 2B in which the insulating film 105 only is stacked on the gate electrode 104.

Figure 2C:
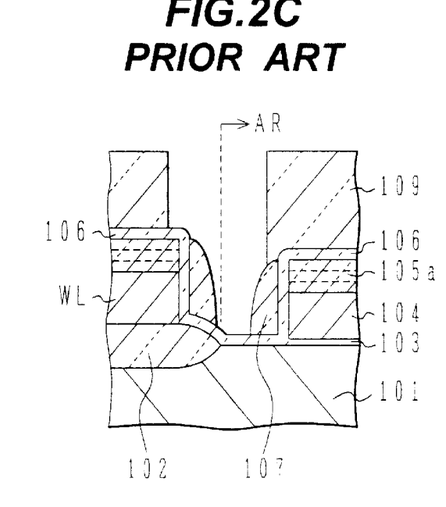

FIG. 2C shows an example of the SAC structure suitable for micro patterning. A field oxide film 102 selectively formed on the surface of a silicon substrate 101 defines an active region AR. A gate oxide film 103 formed on the silicon surface in the active region AR has a gate electrode layer 104 formed thereon. The gate electrode layer 104 is made of a lamination of an impurity doped amorphous silicon layer and a tungsten silicide layer formed on the doped amorphous silicon layer. The gate electrode layer 104 has a laminated insulating layer 105a formed thereon. This laminated insulating layer 105a is made of an HTO film, an SiON film serving as an antireflection film and an SiN film serving as an etching stopper. An oxide film 106 covers the surfaces of the gate electrode layer 104 and laminated insulating layer 105a patterned in the same shape.

A nitride film is formed to cover the oxide film 106. This nitride film is anisotropically etched to remove the nitride film formed on the flat surface and leave side spacers 107 of the nitride film only on the side walls of the gate electrode structure. The gate electrode structure is therefore covered with the nitride film of the laminated insulting layer 105a at its upper surface and with the nitride side spacers 107 at its side walls (and at the side walls of a word line WL in the left side of FIG. 2C). An interlayer insulating film 109 of BPSG or the like is formed on this substrate structure.

A resist pattern is formed on the interlayer insulating film 109 which is then anisotropically etched to form an opening between the nitride side spacers 107. In this case, the opening is formed in a self-aligned manner by using the nitride side spacers 107 as the etching stopper. Here, the upper surface of the gate electrode is also covered with the nitride film of the laminated insulating layer 105a, and the nitride film servers as an etching stopper. Thereafter, the oxide film 106 exposed at the bottom of the opening is removed.

With this structure, however, the oxide film 106 is interposed between the nitride film of the laminated insulating film 105a on the gate electrode and the nitride film on the side wall of the gate electrode 104 (word line WL). As shown in the left side of FIG. 2C, if the resist pattern is misaligned and the upper surface of the oxide film 106 is exposed in an etching atmosphere, the exposed oxide film 106 may also be etched. If this oxide film 106 is etched deeply, a breakdown voltage between the electrode embedded in the contact hole and the gate electrode 104 (or the word line WL) lowers, and an electrical short may occur at the worst.

Figure 2D:
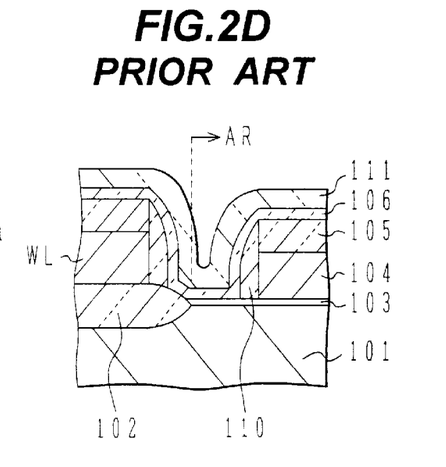

FIG. 2D shows an example of the SAC structure capable of solving the above problem associated with the structure shown in FIG. 2C. With this SAC structure shown in FIG. 2D, a laminated insulating film 105 is formed on a gate electrode 104 and patterned to have the same pattern as the gate electrode (word line). The laminated insulating film 105 is made of a lamination of an HTO film and an SiON film serving as an antireflection film. Thereafter, another HTO film is deposited on the gate electrode structure and anisotropically etched to form side spacers 110. Although side spacers are necessary only in the peripheral circuit area, they are also formed in the memory cell area at the same time.

After the side spacers are formed, a lamination of an HTO film 106 and a nitride film 111 is deposited on the whole surface of the substrate, covering the gate electrode structure. The thickness of the nitride film 111 is set so that it can serve as an etching stopper of an oxide film formed on the nitride film 111. For example, the thickness of the oxide film 106 is about 20 nm and that of the nitride film 111 is 70 nm.

An interlayer insulating film of BPSG or the like is formed on the nitride film 111, and a resist pattern is formed on the interlayer insulating film. The interlayer insulating film is etched by using the resist pattern as an etching mask. This etching of the interlayer insulating film automatically stops at the nitride film 111. Thereafter, the nitride film 111 exposed in the opening is selectively etched and then the oxide film 106 is anisotropically etched to expose the surface of the substrate 101.

If the pattern density of the structure shown in FIG. 2D becomes dense, a space between word lines (gate electrodes) becomes short. The thickness of the side spacer 110 is determined based upon the electrical performance of a transistor of a lightly doped drain structure in the peripheral circuit. The thickness of the nitride film 111 is determined so as to provide a function of an etching stopper. The thickness of the oxide film 106 is determined so that the nitride film 111 does not lower the electrical performance of the transistor.

As the thicknesses of insulating films formed between word lines are limited so as to ensure their essential functions, the width of a recess formed by the nitride film 111 becomes narrow as the pattern density becomes high and the space between word lines becomes short. If the width of the recess becomes narrower than some value, it becomes difficult to sufficiently etch the nitride film and oxide film in the recess after the nitride film is exposed.

This phenomenon is supposed to occur from the following reason. During the etching process of the oxide film such as BPSG formed on the nitride film 111, deposition of process induced substances become dominant if the width of the recess becomes narrower than some extent. Nitride may be deposited and etching the recess of the nitride film 111 becomes difficult.

SUMMARY OF THE INVENTION

It is an object of the present invention to provide a semiconductor device having the structure allowing a SAC window to be reliably opened even if a pattern density is high.

It is another object of the present invention to provide a semiconductor device manufacture method capable of reliably opening a SAC window even if a pattern density is high.

According to one aspect of the present invention, there is provided a semiconductor device having a first area of a high pattern density and a second area of a low pattern density, the high pattern density being higher than the low pattern density, comprising: a semiconductor substrate having the first and the second areas; a gate insulating film formed on the semiconductor substrate; a first gate electrode structure formed on the gate insulating film in the first area; a second gate electrode structure formed on the gate insulating film in the second area; a first laminated insulating film including first and second insulating films, the first insulating film being formed over the semiconductor substrate and covering an upper and side surfaces of the first gate electrode structure, and the second insulating film being formed on the first insulating film and having etching characteristics different from the first insulating film; a second laminated insulating film including third and fourth insulating films, the third and fourth insulating films covering side surfaces of the second electrode structure and being formed by the same processes as the first and second insulating films; first and second pairs of source/drain regions formed in the semiconductor substrate on both sides of the first and second gate electrode structures; an interlayer insulating film formed on the substrate, and covering the first and second laminated insulating films; a first contact hole formed through the interlayer insulating film and the first laminated insulating film, the inner wall of the first contact hole being defined by the first insulating film formed on the side surfaces of the first gate electrode structure and reaching one of the first pair of source/drain regions; a second contact hole formed through the interlayer insulating film, the second contact hole passing a side of the second laminated insulating layer and reaching one of the second pair of source/drain regions; and first and second source/drain electrodes embedded in the first and second contact holes, wherein the interlayer insulating film does not exist between the first source/drain electrode in the first contact hole and the first gate electrode structure.

In the first area having a high pattern density, side spacers are not formed on the side walls of the gate electrode structure. Therefore, a recess becomes wide in which the first laminated insulating film used for forming a SAC is deposited.

In the second area having a low pattern density, side spacers are formed by the second laminated insulating film having the same structure as the first laminated insulating film. Therefore, transistors of the LDD structure can be formed.

Since the first and second laminated insulating films have the same structure, the manufacture process can be simplified.

According to another aspect of the present invention, there is provided a method of manufacturing a semiconductor device comprising the steps of: forming a gate insulating film on a plurality of active regions of a semiconductor substrate: forming a plurality of first gate electrode structures having a high pattern density on the gate insulating film in a first area and a plurality of second gate electrode structures having a low pattern density on the gate insulating film in a second area, the high pattern density being higher than the low pattern density; forming a pair of source/drain regions in the semiconductor substrate on both sides of each of the first and second gate electrode structures; forming a first insulating film over the semiconductor substrate, the first insulating film covering the first and second gate electrode structures; forming a second insulating film on the first insulating film, the second insulating film having etching characteristics different from the first insulating film; forming an interlayer insulating film over the semiconductor substrate, the interlayer insulating film covering the second insulating film in the first area and the second gate electrode structure in the second area and having etching characteristics different from the second insulating film; and forming in a self-alignment manner an opening through the interlayer insulating film and the first and second insulating films in the first area, by using the second insulating film as an etching stopper, the opening reaching one of the source/drain regions and the inner wall of the opening being defined by the first insulating film formed on the side surfaces of the first gate electrode structures.

In the first area having a high pattern density, side spacers are not formed on the side walls of the gate (word) electrode structure, but a lamination of insulating films having different etching characteristic, e.g., an oxide film and a nitride film, covers the gate (word) electrode structure so that the SAC process is made easy. In the second area having a low pattern density, the same lamination is used to form side spacers on the side walls of the gate (word) electrode structure. It is therefore easy to manufacture a highly integrated semiconductor device by a reduced number of processes.

As above, in the area having a high pattern density, contact holes can be formed reliably, whereas in the area having a low pattern density, transistors of the LDD structure can be formed.

DETAILED DESCRIPTION OF THE PREFERRED EMBODIMENTS

Embodiments of the invention will be described with reference to the accompanying drawings.

Figure 1:
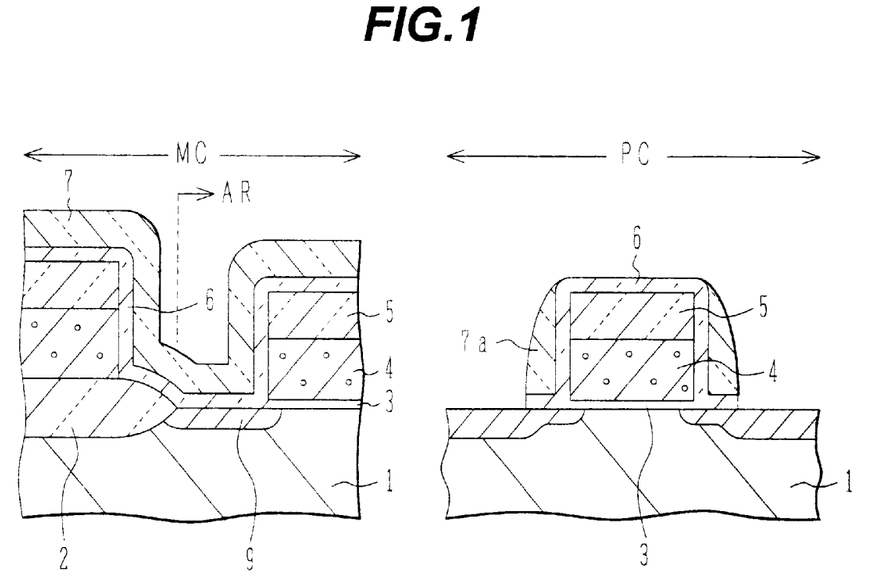
FIG. 1 is a schematic cross sectional view of a semiconductor substrate illustrating a method of manufacturing a semiconductor device according to an embodiment of the invention.

FIG. 1 is a schematic cross sectional diagram showing the structure of a DRAM device according to an embodiment of the invention. The DRAM device has a memory cell area MC and a peripheral circuit area PC. In the memory cell area MC, a number of memory cells are fabricated at a high density. In the peripheral area PC, a control circuit for the memory cells is formed including sense amplifiers, decoders and the like.

For simplifying the drawing, the left side of the drawing shows the structure of a transistor in the memory cell area MC, and the right side shows the structure of a transistor in the peripheral circuit area PC. On the surface of a silicon substrate 1, a field oxide film 2 is formed surrounding an active region AR. A gate oxide film 3 is formed on the active region AR surrounded by the field oxide film 2.

A word line (gate electrode) 4 is formed on the gate oxide film 3, the word line (gate electrode) 4 being made of a lamination of a silicon layer and a silicide layer. An insulating film 5 is formed on the word line 4, which film is made of a lamination of, for example, an HTO film and an SiON film serving as an antireflection film. After the lamination of the word line structure 4 and insulating film 5 is patterned to have the same shape, a lamination of a CVD high temperature oxide (HTO) film 6 and a nitride film 7 is formed over the whole substrate surface, covering the gate electrode structure.

After the memory cell area MC is covered with a photoresist film and the peripheral circuit area PC is exposed, the nitride film 7 is anisotropically etched. In the peripheral circuit area PC, the nitride film 7 is anisotropically etched to leave side spacers 7a on the side walls of the gate electrode structure. If necessary, the HTO film 6 is also anisotropically etched. The side spacers are therefore formed on the side walls of the gate electrode in the peripheral circuit area PC.

Before the side spacers are formed in the peripheral circuit area PC, ions are lightly implanted, and after the side spacers are formed, ions are heavily implanted to form source/drain regions of an LDD structure. A high performance transistor with the LDD structure can therefore be formed. In the memory cell area MC, the lamination of the oxide film and nitride film used for forming the side spacers can be used as an etching stopper. Since side spacers are not formed in the memory cell area MC, a space between word lines becomes broad and an opening with a high aspect ratio becomes easy to be formed.

A more detailed embodiment will be described hereinunder. FIGS. 3A to 3I are cross sectional views of a semiconductor substrate illustrating the processes of manufacturing a semiconductor device according to an embodiment of the invention.

Figure 3A:
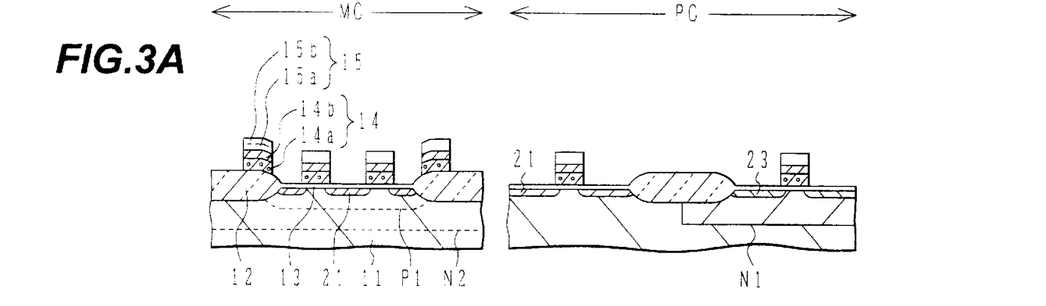
FIGS. 3A to 3I are schematic cross sectional views of a semiconductor substrate illustrating a method of manufacturing a semiconductor device according to an embodiment of the invention.

As shown in FIG. 3A, field oxide films 12 and wells N1, N2 and P1 as many as necessary are formed. For example, a buffer oxide film and a nitride film are formed on the surface of a p-type silicon substrate 11, and the nitride film is patterned to form an oxidation resistant mask. The substrate is covered with a photoresist mask which exposes only the regions where n-type wells N1 and N2 are formed, and n-type impurity ions are implanted. After the resist mask is removed, the field oxide film 12 is formed by local oxidation of silicon (LOCOS). At this time, the implanted n-type impurity ions are activated and driven in so that n-type wells N1 and N2 are formed.

Next, the substrate is covered with a resist mask having an opening which exposes the region where the p-type well P1 is formed, and p-type impurity ions are implanted. In the example shown in FIG. 3A, this p-type well P1 is formed in the n-type well N2, realizing a so-called triple well. These well structures are well known, and any type of a well structure can be formed by known techniques.

After the field oxide film 12 is formed, the oxidation resistant nitride film and the underlying buffer oxide film are removed. A gate oxide film 13 is formed by thermal oxidation on the exposed silicon surface of the substrate.

A lamination of a doped amorphous silicon layer 14a, a tungsten silicide (WSi) layer 14b, a high temperature oxide (HTO) film 15a and an SiON antireflection film 15b is formed on the whole surface of the substrate. This lamination is covered with a photoresist mask, and anisotropic etching is performed to form a word line (gate electrode) structure. The doped amorphous silicon layer 14a and tungsten silicide layer 14b constitute a word line 14. The oxide film 15a and oxynitride film 15B constitute an insulating layer 15 on the word line.

By using resist masks and the word line structure as masks, n- and p-type impurity ions are implanted to form n- and p-type regions of a low impurity concentration.

Figure 3B:
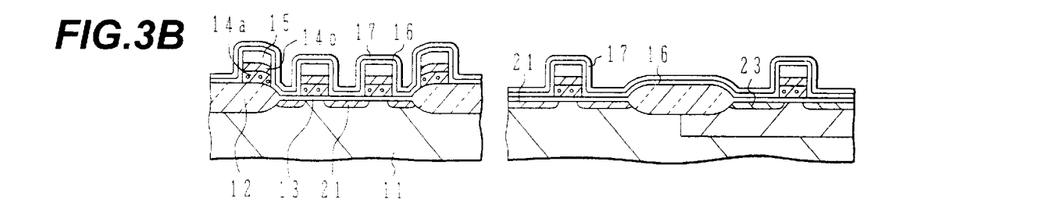

As shown in FIG. 3B, a high temperature oxide (HTO) film 16 and a nitride film 17 are formed by CVD on the whole substrate surface. For example, the oxide film 16 is formed at a temperature of 800° C. by using $SiH_4$ and $N_2O$ as source gases to a thickness of 10 to 30 nm, e.g., 20 nm. The nitride film 17 is formed at a temperature of 650° C. by using $SiH_4$ and $NH_3$ as source gases to a thickness of 30 to 100 nm, e.g., 70 nm.

Of the word line structure, the silicon layer 14a has a height of about 50 nm, the WSi layer 14b has a height of about 150 nm, and the insulating film 15 has a height of about 50 nm, totaling in about 250 nm. The height of the word line structure may be set in a range from 100 to 300 nm.

Figure 3C:
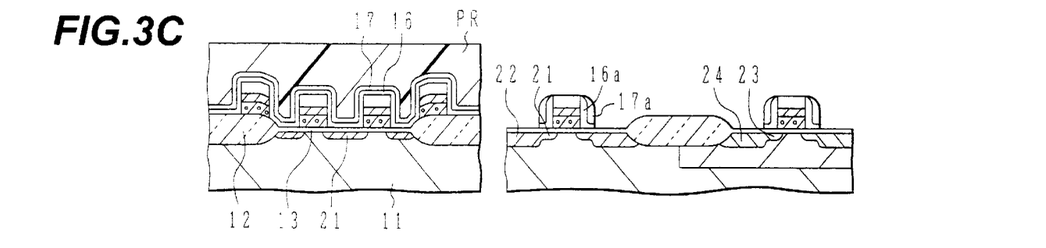

As shown in FIG. 3C, the memory cell area MC is covered with a resist mask PR and the peripheral circuit area PC is exposed. The lamination of the oxide film 16 and nitride film 17 exposed in the peripheral circuit area PC is anisotropically etched to leave it only on the side walls of the word line, as side spacers 16a and 17a. The nitride film 17 on the source/drain region is fully removed and the oxide film 16 is also removed. In FIG. 3C, only the gate oxide film 13 is shown left.

For example, the side spacers are formed by reactive ion etching (RIE) using $CHF_3/CF_4/O_2$=12/12/5 sccm as etching gas, under the conditions of a pressure of 50 mTorr and a RF power of 300 W. With this etching, most of the silicon nitride film 17 is etched. The etching conditions are changed when the silicon nitride film 17 is left a little on the flat substrate surface.

For example, the next etching is performed by anode coupling plasma etching using $SF_6$/HBr=200/25 sccm as etching gas, under the conditions of a pressure of 500 mTorr and a power of 150 W, to thereby perform quasi-anisotropic etching of the nitride film left on the flat surface and the underlying oxide film.

With the above processes, the upper surfaces and side walls of the word line structure in the memory cell area MC are covered with the lamination of the oxide film 16 and nitride film 17, whereas in the peripheral circuit area PC, the side walls of the lamination of the oxide film 16a and nitride film 17a are formed on the side walls of the word line structure.

Thereafter, by using resist masks, n- and p-type impurity ions are implanted into the n- and p-channel transistor regions to form source/drain regions 22 and 24 of a high impurity concentration. In this manner, CMOS transistors of the LDD structure are formed in the peripheral circuit area PC.

Figure 3D:
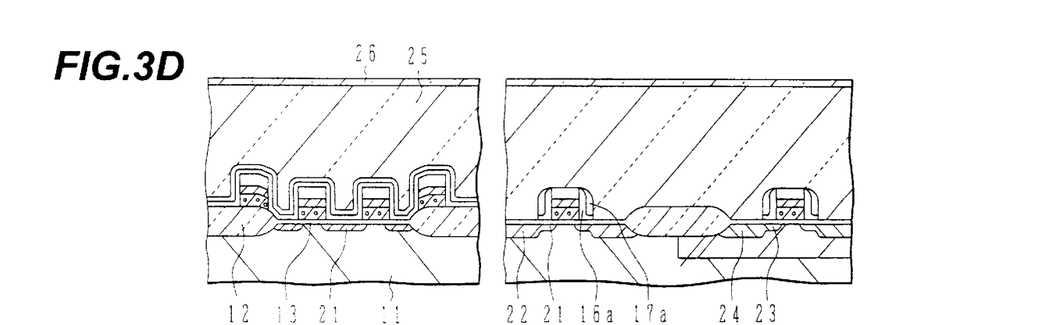

As shown in FIG. 3D, an insulating film 25 of borophosphosilicate glass (BPSG) is formed on the whole substrate surface, covering the word line structure. For example, the BPSG insulating film 15 is formed to a thickness of 1.75 μm. The insulating film 25 is planarized by reflow, chemical mechanical polishing or both. A high temperature oxide (HTO) film 26 is formed on the planarized surface of the insulating film 25.

Figure 3E:
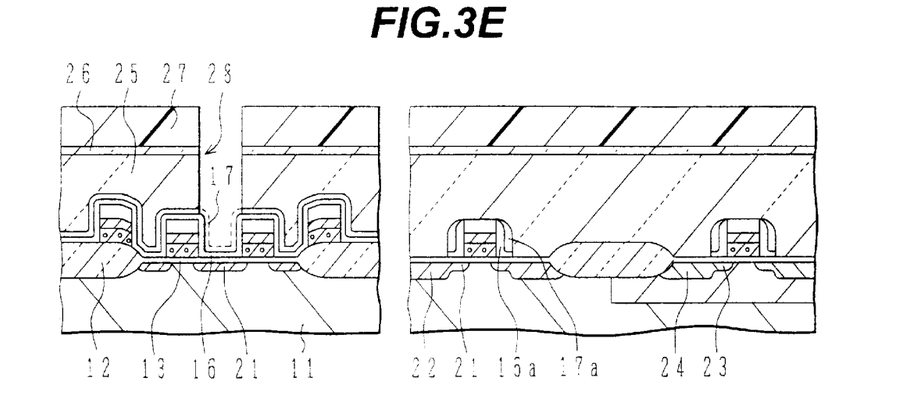

As shown in FIG. 3E, a resist mask 27 is formed on the HTO Film 26, the mask having an opening at an area corresponding to the bit line contact area. By using the resist mask 27 as an etching mask, a bit line contact hole 28 is formed. First, oxide films including the HTO film 26 and BPSG film 25 are etched until the nitride film 17 at the bottom of the opening is exposed.

Next, the nitride film 17 is selectively etched. For example, this selective nitride etching is performed at an etching selection ratio of about 30 relative to the silicon oxide on the flat surface, by using an etcher adapted for polysilicon. This etching removes the nitride film 17 exposed in the opening. In the memory cell area MC, since the side spacers are not formed on the word line structure and the width of the recess formed by the nitride film 17 is broad, the etching can be performed stably without being automatically stopped by an otherwise narrow recess.

After the nitride film 17 is etched, the oxide films 16 and 13 at the bottom of the opening are anisotropically etched. With this etching, the oxide film on the side walls of the word line structure is hardly etched and left substantially unetched.

Figure 3F:
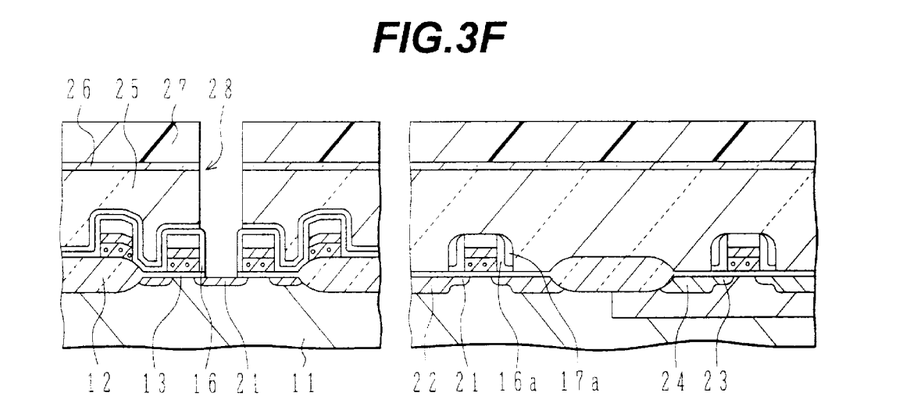

FIG. 3F shows the outline of the cross sectional structure after the above-described etching processes. The bit line contact hole 28 is formed through the HTO film 26, BPSG insulating film 25, nitride film 17 and oxide films 16 and 13, and the source/drain region is exposed at the bottom of the contact hole 28, with the oxide film 16 being left on the side walls of the word line structure. The resist mask 27 is thereafter removed.

Figure 3G:
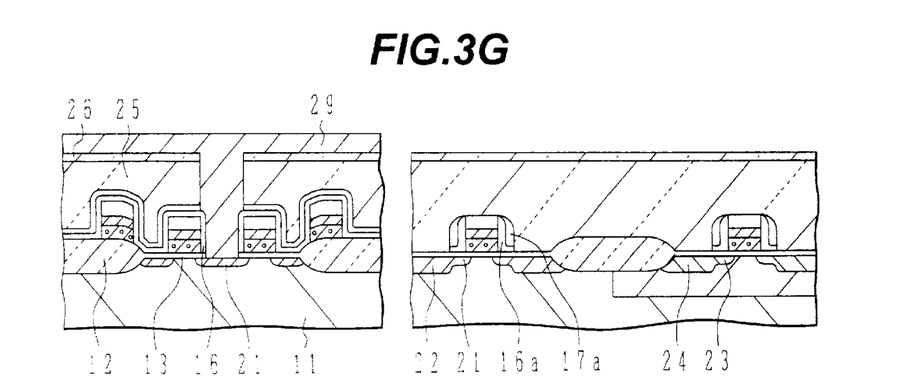

As shown in FIG. 3G, a bit line wiring layer 29 is deposited over the whole substrate surface. For example, a laminated polycide electrode layer of a doped amorphous silicon layer and a tungsten silicide layer is deposited by CVD. A metal wiring layer may be deposited in place of the polycide electrode layer. Instead of CVD, sputtering may be used. The bit line wiring layer 29 is then patterned to form a bit line 29.

Figure 3H:
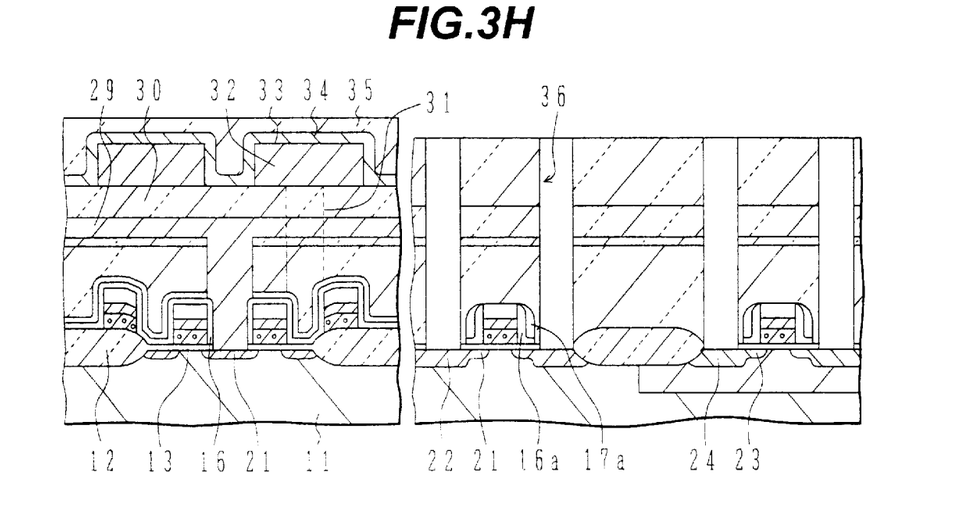

As shown in FIG. 3H, a BPSG insulating layer 30 is formed covering the bit line 29. The surface of the BPSG insulating layer 30 may be planarized if necessary. An HTO film may be formed on the BPSG insulating layer. By using a resist mask, a storage electrode contact hole 31 is formed. This storage electrode contact hole 31 can be formed in the manner similar to the etching processes described with reference to FIGS. 3E and 3F.

Figure 4A:
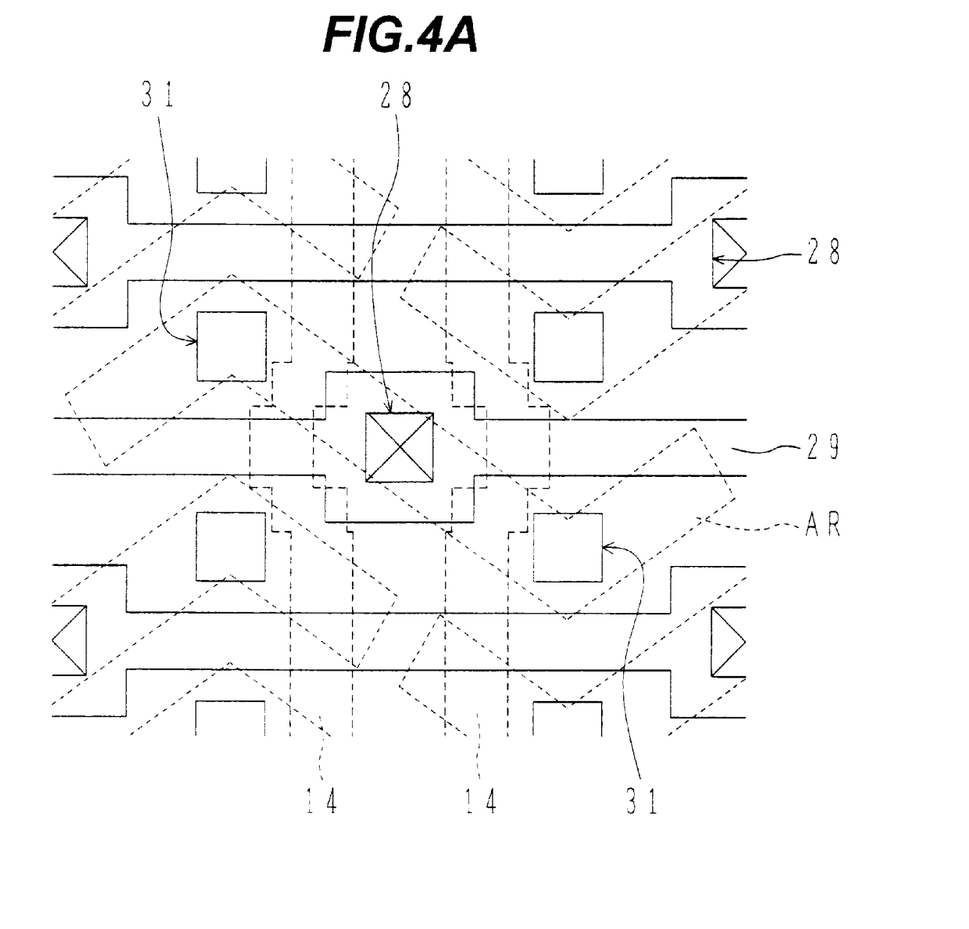
FIGS. 4A to 4D are a plan view and cross sectional views further illustrating the embodiment shown in FIGS. 3A to 3I.

FIG. 4A is a schematic plan view showing a layout of the semiconductor device formed by the embodiment method. The bit lines 29 are formed in parallel in the horizontal direction in FIG. 4A, and the word lines 14 are formed in the vertical direction. Each active region AR defined by the field oxide film has a Z-like shape and is formed obliquely, e.g., at an angle of about 30° relative to the bit line, so as to intersect with the bit and word lines. The storage electrode contact hole 31 is positioned shifted from the bit line contact hole 20 both in the horizontal and vertical directions. Therefore, the storage electrode contact hole 31 is shown in the cross sectional view of FIG. 3H at a different section.

A storage electrode cell plate 32 is formed by embedding the storage electrode contact hole 31 with electrode material and by patterning a cylindrical portion or a cubic portion above the contact hole.

A nitride film 33 is formed on the surface of the cell plate 32 which is covered with an opposing electrode layer 34.

Figure 4B:
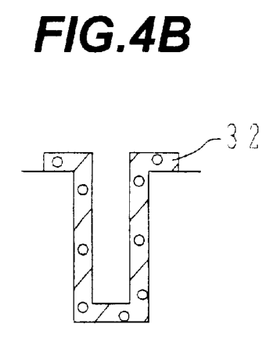
Figure 4C:
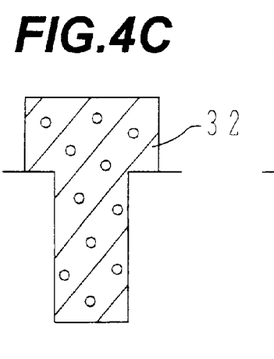
Figure 4D:
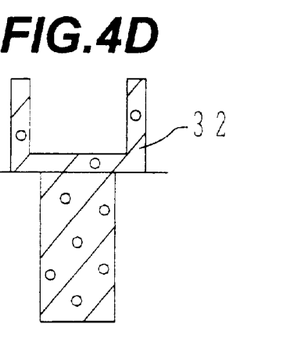

FIGS. 4B, 4C and 4D show examples of cross-sectional shape of a cell plate. FIG. 4B shows a cell plate having the simplest shape. A silicon film is partially embedded in a storage electrode contact hole. If the surface of the film is formed by HSG or rugged polysilicon with coarse surface, the surface area of the cell plate is almost doubled.

FIG. 4C shows a cell plate formed by embedding a contact hole with polysilicon and patterning a cylindrical portion or cubic portion above the contact hole.

FIG. 4D shows a cell plate having a tubular portion in order to increase the surface area. In both cases of FIGS. 4C and 4D, if the surface of the cell plate is formed with coarse surface polysilicon, the surface area of the cell plate is almost doubled.

After the storage capacitor is formed, the surface thereof is covered with an insulating film 35 of BPSG or the like. The insulating film 35 is planarized if necessary.

In the peripheral circuit area PC, a contact hole 36 is formed by using a resist mask. Since the nitride film 17 is not formed on the source/drain region in the peripheral circuit area PC, the contact hole reaching the source/drain region can be formed easily by etching only the oxide film.

Figure 3I:
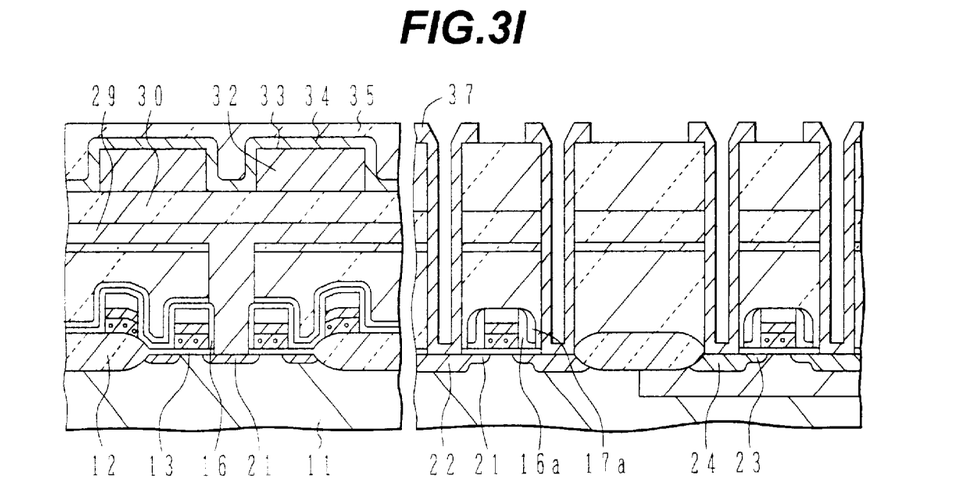

As shown in FIG. 3I, necessary electrode/wiring interconnects 37 are formed in the peripheral circuit area PC. The electrode/wiring layer is made of, for example, a lamination of Ti/TiN/W. The Ti layer is formed by sputtering, the TiN layer is formed by sputtering or CVD, and the W layer is formed by CVD. The wiring layer 37 is then patterned.

Necessary insulating layers and wiring layers are formed to complete a semiconductor memory device.

In the embodiment described above, a SAC process is performed twice for forming the bit line contact hole and storage electrode contact hole. It is not always required to perform the SAC process twice.

FIGS. 5A to 5G are cross sectional views of a semiconductor substrate illustrating the processes of manufacturing a semiconductor device according to another embodiment of the invention.

In this embodiment, a SAC process is performed only once. The processes shown in FIGS. 3A to 3D are first performed.

Figure 5A:
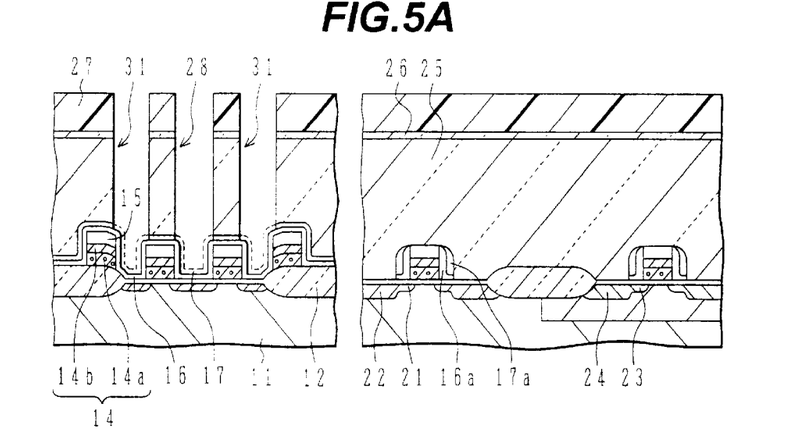
FIGS. 5A to 5G are schematic cross sectional views of a semiconductor substrate illustrating a method of manufacturing a semiconductor device according to another embodiment of the invention.

As shown in FIG. 5A, a resist mask 27 is formed on the surface of the substrate having the structure shown in FIG. 3D, and etching is done to form both a bit line contact hole 28 and a storage electrode contact hole 31 at the same time. This contact hole etching process is performed in a self-alignment manner similar to the etching processes described with reference to FIGS. 3E and 3F.

Figure 6:
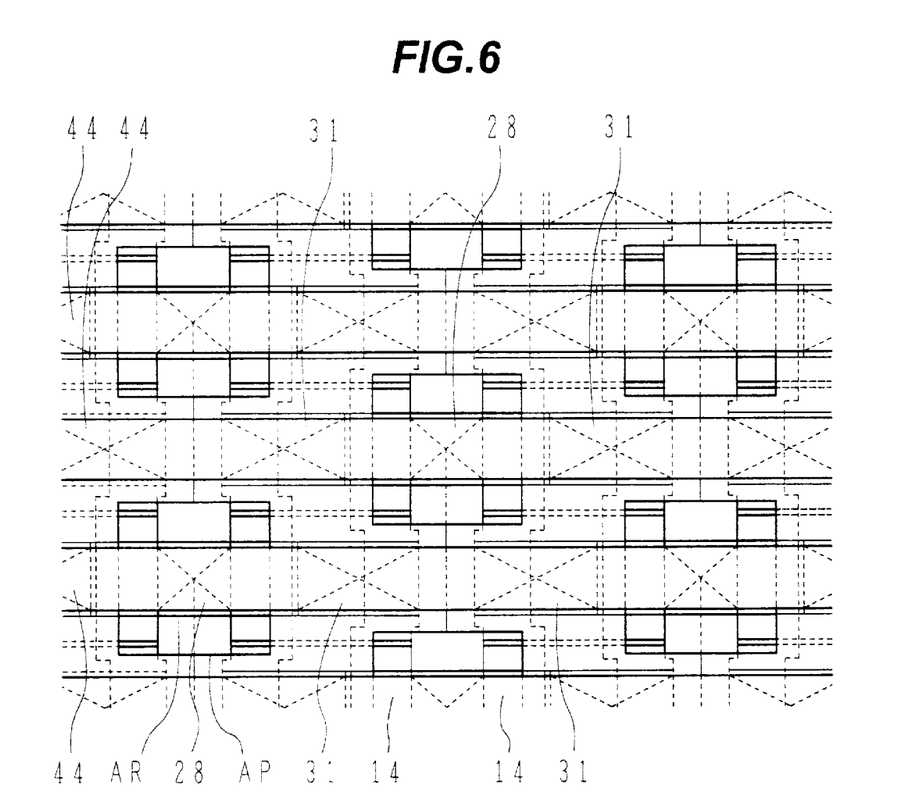
FIG. 6 is a schematic plan view further illustrating the embodiment shown in FIGS. 5A to 5G.

FIG. 6 is a schematic plan view showing the layout of a semiconductor device manufactured by the method of this embodiment. In this layout, bit lines 44 extend in the horizontal direction, whereas word lines 14 extend in the vertical direction. An active region AR is formed in parallel to and under the bit line. The bit line contact hole 28 and storage electrode contact hole 31 are juxtaposed in the horizontal direction. A bit contact area AP for the bit line is disposed in a broader area over the bit line contact hole 28. For realizing this layout, the storage electrode and bit line are required to be disposed at different layer levels.

Figure 5B:
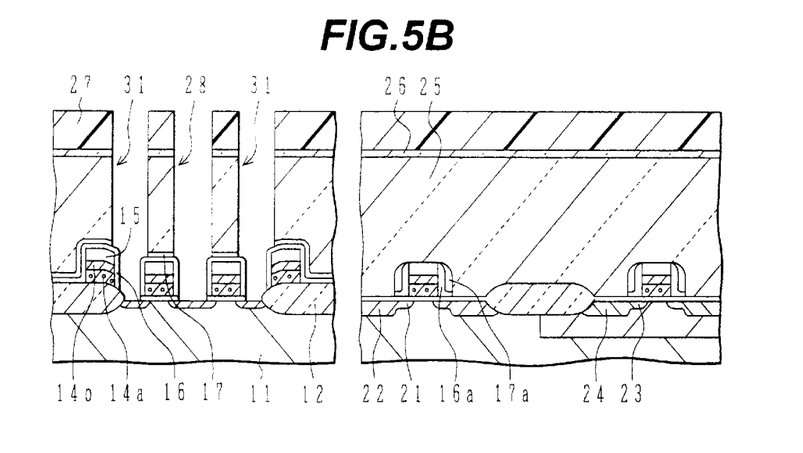

FIG. 5B shows the outline of the cross sectional structure after the contact holes are formed. The source/drain region is exposed at the bottom of the contact hole in the memory cell area.

Figure 5C:
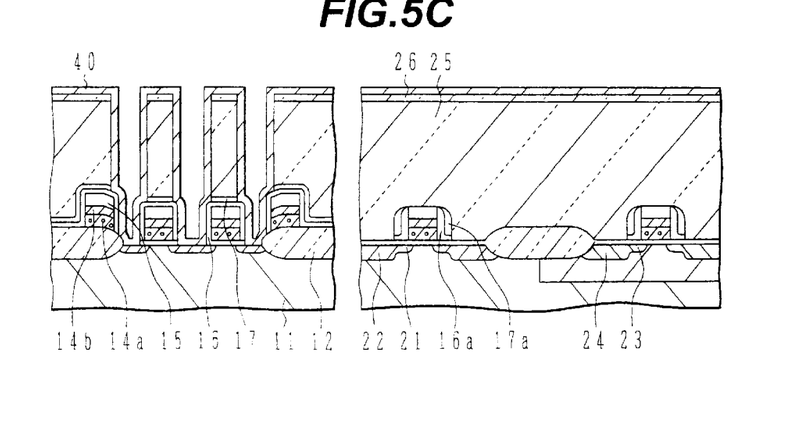

As shown in FIG. 5C, an electrode layer 40 is formed on the exposed surface of the contact hole, by depositing a doped amorphous silicon layer and forming the surface of this layer with rugged polysilicon. Rugged polysilicon is polysilicon having semisphere shapes grown under the growth conditions of crystal phase near the boundary between an amorphous phase and a crystal phase.

Figure 5D:
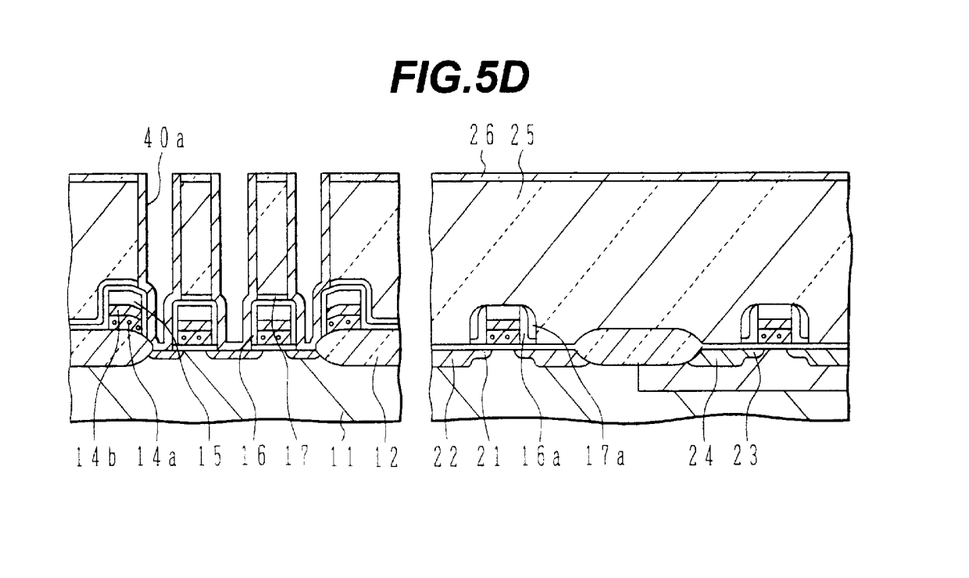

As shown in FIG. 5D, the substrate surface is polished by CMP to remove the electrode layer 40 on the upper flat surface and leave an electrode layer 40a only in the contact hole. This process does not require patterning and hence position alignment. It is therefore possible to form both bit contacts and storage electrode contacts separated from each other, only by one SAC process and by one CMP process.

Figure 5E:
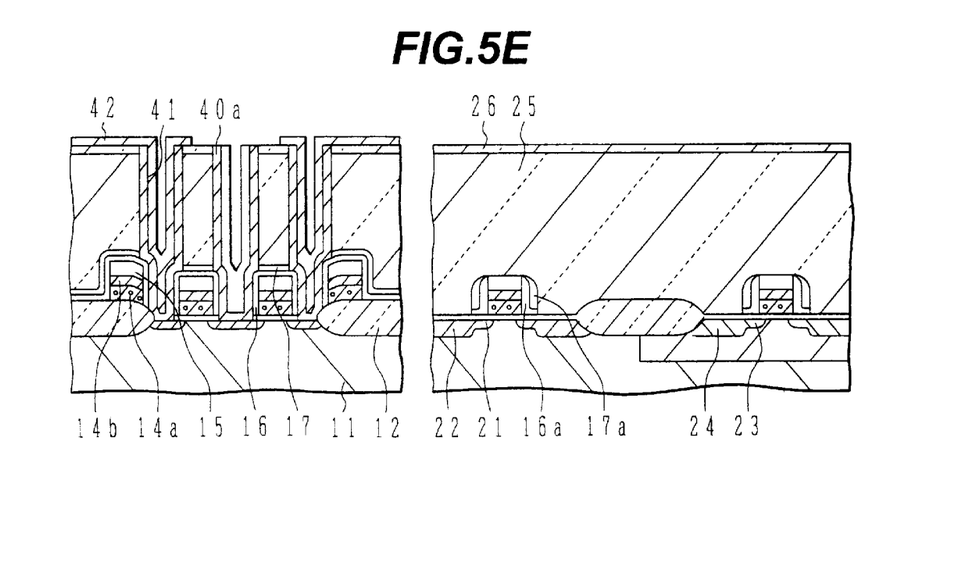

As shown in FIG. 5E, a silicon nitride film 41 is deposited by CVD, covering the surface of the electrode layer 40a. A doped amorphous silicon film 42 is then formed, covering the surface of the nitride film 41.

By using a resist mask, the silicon film 42 is patterned to separate the storage electrode silicon film from the silicon film on the bit contact hole.

Figure 5F:
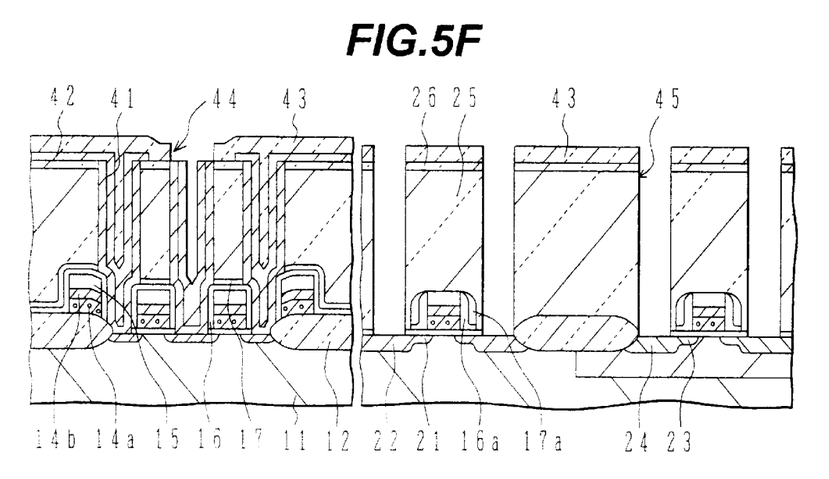

As shown in FIG. 5F, a BPSG layer 43 is formed on the substrate surface and the surface of the BPSG layer 43 is planarized by performing, for example, a reflow process for 20 minutes at 800° C. A resist pattern is formed on the surface of the BPSG layer 43 and an opening exposing the bit contact hole is formed.

By using another resist mask, contact holes 45 reaching the source/drain regions are formed in the peripheral circuit area.

Figure 5G:
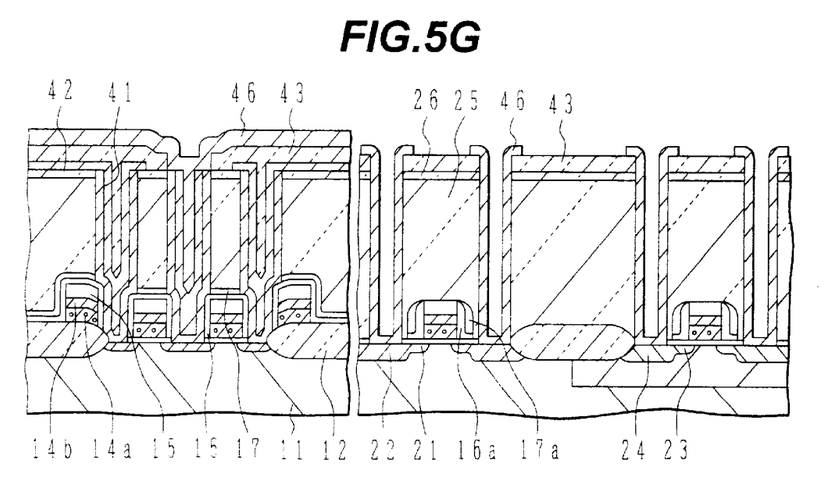

As shown in FIG. 5G, a wiring layer 46 is deposited and patterned to form a bit line in the memory cell area and wiring patterns in the peripheral circuit area. The wiring layer 46 may be a lamination of Ti/TiN/W. The Ti layer can be formed by sputtering, the TiN layer can be formed by CVD or sputtering, and the W layer can be formed by CVD. In forming a laminated wiring layer, rapid thermal annealing may be performed after each layer is formed in order to prevent the removal of the wiring layer.

Necessary insulating layers and wiring layers are thereafter formed to complete a semiconductor memory device.

The present invention has been described in connection with the preferred embodiments. The invention is not limited only to the above embodiments. It will be apparent for those skilled in the art that various modifications, improvements, combinations, and the like can be made.

What is claimed is:

1. A semiconductor device having a first area of a high pattern density and a second area of a low pattern density, the high pattern density being higher than the low pattern density, comprising:

a semiconductor substrate having the first and the second areas;

a gate insulating film formed on said semiconductor substrate;

a first gate electrode structure formed on said gate insulating film in the first area;

a second gate electrode structure formed on said gate insulating film in the second area;

a first laminated insulating film including first and second insulating films, said first insulating film being formed over said semiconductor substrate and covering an upper and side surfaces of said first gate electrode structure, and said second insulating film being formed on said first insulating film and having etching characteristics different from said first insulating film;

a second laminated insulating film including third and fourth insulating films, said third and fourth insulating films covering side surfaces of said second electrode structure and being formed by the same processes as said first and second insulating films;

first and second pairs of source/drain regions formed in said semiconductor substrate on both sides of said first and second gate electrode structures;

an interlayer insulating film formed on the substrate, and covering said first and second laminated insulating films;

a first contact hole formed through said interlayer insulating film and said first laminated insulating film, the inner wall of said first contact hole being defined by the first insulating film formed on the side surfaces of said first gate electrode structure and reaching one of said first pair of source/drain regions;

a second contact hole formed through said interlayer insulating film, said second contact hole passing a side of said second laminated insulating layer and reaching at least one of said second pair of source/drain regions; and first and second source/drain electrodes embedded in said first and second contact holes, wherein said interlayer insulating film does not exist between said first source/drain electrode in said first contact hole and said first gate electrode structure.

2. A semiconductor device according to claim 1, wherein said second laminated insulating film forms side spacers on the side surfaces of said second gate electrode structure.

3. A semiconductor device according to claim 1, wherein said first gate electrode structure includes a pair of gate electrode structures disposed near to each other, and said first contact hole is formed between the pair of gate electrode structures.

4. A semiconductor device according to claim 1, wherein said first and third insulating films are made of oxide, and said second and fourth insulating films are made of nitride.

5. A semiconductor device according to claim 1, wherein between said first source/drain electrode in said first contact hole and said first gate electrode structure, said second insulating film is removed and said first insulating film is left.

6. A semiconductor device according to claim 1, wherein said interlayer insulating film includes a fifth insulating film made of oxide which contains phosphorous and boron and a sixth insulating film made of non-doped oxide and formed on said fifth insulating film.

7. A semiconductor device according to claim 6, wherein said fifth insulating film has a flat surface.

8. A semiconductor device according to claim 1, wherein said gate electrode structure includes a gate electrode layer and a protective insulating film formed on the gate electrode layer.

9. A semiconductor device according to claim 1, wherein said first source/drain electrode is a bit contact.

10. A semiconductor device according to claim 1, wherein said first source/drain electrode is a storage electrode contact of a memory cell.

11. A semiconductor device having a first area of a high pattern density and a second area of a low pattern density, the high pattern density being higher than the low pattern density, comprising:

a semiconductor substrate having the first and the second areas;

a gate insulating film formed on said semiconductor substrate;

a first gate electrode structure formed on said gate insulating film in the first area;

a second gate electrode structure formed on said gate insulating film in the second area;

a first laminated insulating film including first and second insulating films, said first insulating film being formed over said semiconductor substrate and covering an upper and side surfaces of said first gate electrode structure, and said second insulating film being formed on said first insulating film and having etching characteristics different from said first insulating film;

a second laminated insulating film including third and fourth insulating films, said third and fourth insulating films covering side surfaces of said second electrode structure and being formed by the same processes as said first and second insulating films;

first and second pairs of source/drain regions formed in said semiconductor substrate on both sides of said first and second gate electrode structures;

an interlayer insulating film formed on the substrate, and covering said first and second laminated insulating films;

a first contact hole formed through said interlayer insulating film and said first laminated insulating film, the inner wall of said first contact hole being defined by the first insulating film formed on the side surfaces of said first gate electrode structure and reaching one of said first pair of source/drain regions;

a second contact hole formed through said interlayer insulating film, said second contact hole passing a side of said second laminated insulating layer and reaching at least one of said second pair of source/drain regions;

first and second source/drain electrodes embedded in said first and second contact holes; and side spacers on the side surfaces of said second gate electrode structure formed by said second laminated insulating film, wherein said second pairs of source/drain regions contain pairs of low impurity regions adjacent to said second gate electrode structure with a width corresponding to the thickness of said second laminated insulating film, and pairs of high impurity regions adjacent to the side of said low impurity regions.

12. A semiconductor device according to claim 11, wherein said first gate electrode structure includes a pair of gate electrode structures disposed near to each other, and said first contact hole is formed between the pair of gate electrode structures.

13. A semiconductor device according to claim 11, wherein said first and third insulating films are made of oxide, and said second and fourth insulating films are made of nitride.

14. A semiconductor device according to claim 11, wherein between said first source/drain electrode in said first contact hole and said first gate electrode structure, said second insulating film is removed and said first insulating film is left.

15. A semiconductor device according to claim 11, wherein said interlayer insulating film includes a fifth insulating film made of oxide which contains phosphorous and boron and a sixth insulating film made of non-doped oxide and formed on said fifth insulating film.

16. A semiconductor device having a first area of a high pattern density and a second area of a low pattern density, the high pattern density being higher than the low pattern density, comprising:

a semiconductor substrate having the first and the second areas;

a gate insulating film formed on said semiconductor substrate;

a first gate electrode structure formed on said gate insulating film in the first area;

a second gate electrode structure formed on said gate insulating film in the second area;

a first laminated insulating film including first and second insulating films, said first insulating film being formed over said semiconductor substrate and covering an upper and side surfaces of said first gate electrode structure, and said second insulating film being formed on said first insulating film and having etching characteristics different from said first insulating film;

a second laminated insulating film including third and fourth insulating films, said third and fourth insulating films covering side surfaces of said second electrode structure and being formed by the same processes as said first and second insulating films;

first and second pairs of source/drain regions formed in said semiconductor substrate on both sides of said first and second gate electrode structures;

an interlayer insulating film formed on the substrate, and covering said first and second laminated insulating films;

a first contact hole formed through said interlayer insulating film and said first laminated insulating film, the inner wall of said first contact hole being defined by the first insulating film formed on the side surfaces of said first gate electrode structure and reaching one of said first pair of source/drain regions;

a second contact hole formed through said interlayer insulating film, said second contact hole passing a side of said second laminated insulating layer and reaching at least one of said second pair of source/drain regions;

first and second source/drain electrodes embedded in said first and second contact holes; and side spacers on the side surfaces of said second gate electrode structure formed by said second laminated insulating film, wherein between said first source/drain electrode in said first contact hole and said first gate electrode structure, and said second insulating film is removed and said first insulating film is left.

17. A semiconductor device according to claim 16, wherein said first gate electrode structure includes a pair of gate electrode structures disposed near to each other, and said first contact hole is formed between the pair of gate electrode structures.

18. A semiconductor device according to claim 16, wherein said first and third insulating films are made of oxide, and said second and fourth insulating films are made of nitride.

19. A semiconductor device according to claim 16, wherein said interlayer insulating film includes a fifth insulating film made of oxide which contains phosphorous and boron and a sixth insulating film made of non-doped oxide and formed on said fifth insulating film.

* * * * *